United States Patent [19]
Tanaka et al.

[11] Patent Number: 5,757,622
[45] Date of Patent: May 26, 1998

[54] CONNECTING STRUCTURE FOR ELECTRONIC EQUIPMENT

[75] Inventors: Hidetake Tanaka, Gose; Takayoshi Yamagishi, Kashihara, both of Japan

[73] Assignee: Sharp Kabushiki Kaisha, Osaka, Japan

[21] Appl. No.: 871,979

[22] Filed: Jun. 10, 1997

[30] Foreign Application Priority Data

Nov. 13, 1996 [JP] Japan ................. 8-301894

[51] Int. Cl.⁶ .................. H05K 1/14; H01R 33/00
[52] U.S. Cl. .................. 361/737; 439/326; 439/946; 257/679; 235/486
[58] Field of Search .................. 361/737, 740, 361/747, 759, 684, 686; 235/482, 483, 486, 492, 495; 257/679; 439/326, 76.1, 946, 951

[56] References Cited

U.S. PATENT DOCUMENTS

| | | | |
|---|---|---|---|
| 3,637,994 | 1/1972 | Ellingboe | 257/679 |
| 4,600,257 | 7/1986 | Fushimoto | 439/137 |
| 4,791,608 | 12/1988 | Fushimoto | 439/137 |
| 4,927,368 | 5/1990 | Shino | 439/66 |
| 5,236,372 | 8/1993 | Yunoki et al. | 439/951 |
| 5,337,220 | 8/1994 | Granitz | 361/816 |
| 5,395,251 | 3/1995 | Rodriguez et al. | 439/326 |

FOREIGN PATENT DOCUMENTS 5-35904  5/1993  Japan.

*Primary Examiner*—Leo P. Picard
*Assistant Examiner*—John B. Vigushin
*Attorney, Agent, or Firm*—Nixon & Vanderhye P.C.

[57] ABSTRACT

There is provided a connecting structure for electronic equipment which is capable of preventing the destruction of on-board ICs and the like due to static electricity and capable of preventing the contamination of electrode pads to maintain a satisfactory conducting performance. The structure includes a groove provided on a holder section on a substrate housed in a card; a plurality of electrode pads provided at the bottom of the groove; and a rubber connector provided on a mating apparatus, which can be electrically connected to the plurality of electrode pads and which employs conductive rubber. The structure also comprises a plurality of projections projecting inwardly in the groove at fixed intervals on both side walls of the groove and at the positions facing each other on both side walls of the groove.

3 Claims, 7 Drawing Sheets

CONNECTING STRUCTURE FOR ELECTRONIC EQUIPMENT

BACKGROUND OF THE INVENTION

The present invention relates to a connecting structure for electronic equipment which structure is employed to connect a card-like apparatus having on-board memory ICs (integrated circuits) and the like for retaining stored information, to a mating apparatus.

Conventionally, pin connectors have been used as connecting structures for electronic equipment to electrically connect a card-like apparatus (e.g., memory card) to a mating apparatus. In the case that any pins in such a pin connector are broken off with repeated insertion/disconnection of the card-like apparatus, however, the pins are not easy to replace and it is difficult to restore the card-like apparatus because of the clogging of connector holes of the card-like apparatus with the broken pins, or the like reason. Besides, the above-mentioned connecting structures for electronic equipment have a problem that sand, dust or the like enters connector holes of the card-like apparatus and clogs the holes.

An example of connecting structure for electronic equipment which solves these problems is a structure such that a card-like apparatus is connected to a mating apparatus via a rubber connector which employs conductive rubber. In the connecting structure for electronic equipment, as shown in FIG. 7, a holder section 83 for holding a rubber connector formed on a socket of a mating apparatus (see FIG. 9) is so provided as to sandwich a substrate 81, around an area including a plurality of electrode pads 82 which are arranged in two rows and have been formed at fixed intervals on the substrate 81 housed in a card 80 as an example of a card-like apparatus. In FIG. 8, which is a section view taken along the line VIII—VIII of FIG. 7, on both the side walls of a groove 90 in the holder section 83 are provided inclined surfaces 90a, 90b for guiding the rubber connector of the socket of the mating apparatus into the groove 90 in the holder section 83. In FIG. 9, which is a perspective view of main parts of a socket 100 to be connected to the plurality of electrode pads 82 (shown in FIG. 8) on the card 80 in FIG. 7, the socket 100 comprises a socket base 101, a rubber connector 102 mounted to the socket base 101, and a supporting section 103 for holding the rubber connector 102. In such a connecting structure for electronic equipment, in the case that its conducting performance has been degraded by the damage to the rubber connector 102 made of conductive rubber, the conducting performance can be easily restored by replacing the rubber connector 102 on the socket 100; in the case that dirt or dust has been deposited on the plurality of electrode pads 82 on the card 80, the conducting performance can be easily restored by wiping the surfaces of the electrode pads 82.

The connecting structure for electronic equipment, however, has a problem that, when a human finger or the like touches the electrode pads 82 on the card 80 during connecting the card 80 to the mating apparatus, on-board ICs (integrated circuits) and the like on the substrate 81 of the card 80 may be destroyed by the influence of static electricity built up in the human body. There is another problem that the deposition on the electrode pads 82 of the dirt, dust or the like which has stuck to the human finger or the like may deteriorate the conducting performance of the connecting structure.

SUMMARY OF THE INVENTION

An object of the present invention is therefore to provide a connecting structure for electronic equipment which is capable of preventing the destruction of on-board ICs or the like on a card-like apparatus due to static electricity and capable of preventing the contamination of electrode pads to maintain a satisfactory conducting performance.

In order to achieve the aforementioned object, there is provided a connecting structure for electronic equipment to electrically connect a card-like apparatus to a mating apparatus, the connecting structure comprising:

a groove provided on a holder section on a substrate housed in the card-like apparatus;

a plurality of electrode pads provided at the bottom of the groove;

a rubber connector provided on the mating apparatus, which can be electrically connected to the plurality of electrode pads and which employs conductive rubber; and a plurality of projections projecting inwardly in the groove at fixed intervals on both side walls of the groove and at positions facing each other on both side walls of the groove.

In the connecting structure for electronic equipment according to the first embodiment of the present invention, when the rubber connector of the mating apparatus made of conductive rubber is fitted into the groove provided on the holder section of the card-like apparatus, the plurality of electrode pads of the card-like apparatus are brought into electrical contact with the rubber connector. Both side walls of the groove where the plurality of electrode pads of the card-like apparatus are at the bottom thereof are provided with the plurality of projections so that both the side walls of the groove are uneven. The widths of the areas between the projections in the groove of the holder section of the card-like apparatus are made as small as possible, so that a human finger or the like does not come into direct contact with the electrode pads at the bottom of the groove. As a result, ICs and the like on the card-like apparatus are protected from the static electricity built up in a human body and the contamination of the electrode pads on the card-like apparatus is prevented with the result that the conducting performance can be maintained.

Also, there is provided a connecting structure for electronic equipment, wherein the shapes of the plurality of projections as seen in the direction of the normal to the bottom surface of the groove are rectangular in general.

In the connecting structure for electronic equipment according to the second embodiment of the present invention, the plurality of projections of which the shapes as seen in the direction of the normal to the bottom surface of the groove are rectangular in general are provided at fixed intervals on both side walls of the groove and at the positions facing each other on both side walls of the groove, so that the sections having a relatively large width and the sections having a relatively small width can be accurately provided alternately along the groove and the groove both sides of which have projections and depressions can be easily formed.

Also, there is provided a connecting structure for electronic equipment, wherein fitting sections into which the plurality of projections on the card-like apparatus fit are provided in supporting sections for supporting the rubber connector of the mating apparatus.

In the connecting structure for electronic equipment according to the third embodiment of the present invention, each projection provided on the card-like apparatus fit into a fitting section provided in a supporting section of the mating apparatus, and each projection of the card-like apparatus and a supporting section of the mating apparatus do not interfere with each other, so that the rubber connector and the supporting sections can be securely housed in the groove of the card-like apparatus.

DETAILED DESCRIPTION OF THE PREFERRED EMBODIMENTS

An embodiment of the structure for electronic equipment according to the invention will now be described in detail referring to the attached drawings.

Figure 1:
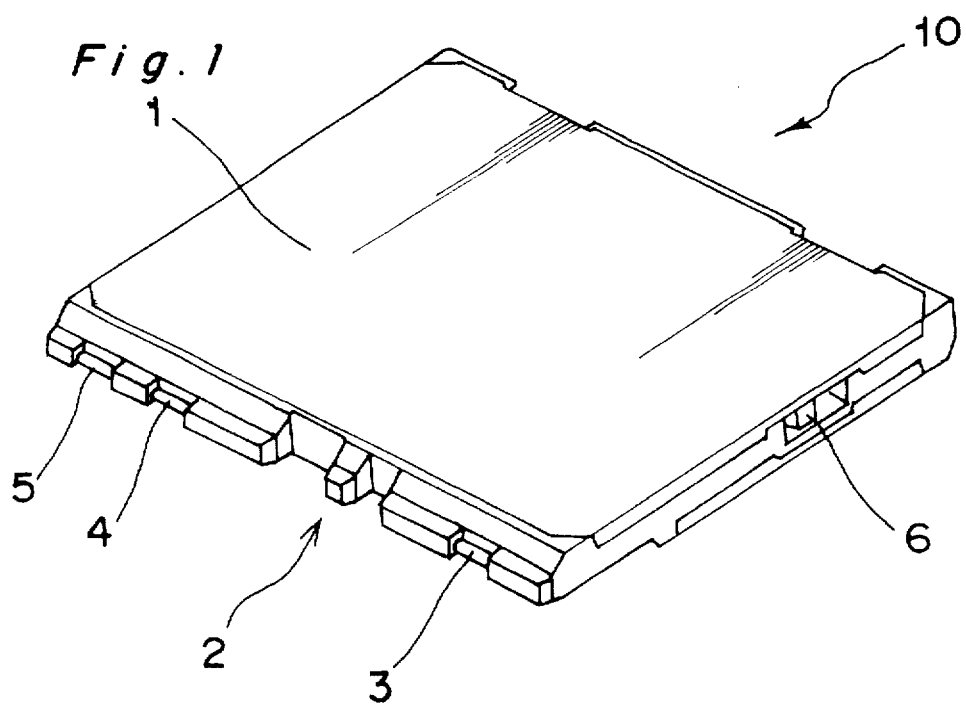
FIG. 1 is a perspective view of the upper surface of a card as an example of a card-like apparatus comprising a connecting structure for electronic equipment in accordance with an embodiment of the invention, as seen diagonally from above.

FIG. 1 is a perspective view of the upper surface of a card 10 as an example of a card-like apparatus comprising a connecting structure for electronic equipment, as seen diagonally from above; in a generally rectangular casing 1 is housed a substrate (not shown) equipped with memory ICs and the like, and the card 10 has a connecting section 2, which is to be connected to a mating apparatus described later, along one long side of the casing 1. The connecting section 2 comprises: a source voltage supply terminal 3 provided in the vicinity of a corner of the casing 1; a card-detecting terminal 4 for detecting the insertion of the card 10 into a socket (not shown) of a mating apparatus (not shown), which is provided in the vicinity of the corner opposed to the source voltage supply terminal 3; a ground terminal 5 provided so as to be nearer to the corner than the card-detecting terminal 4; a plurality of electrode pads 12 and a holder section 13 (see FIG. 2) both of which will be described later. On the short side of the casing 1 in the vicinity of the source voltage supply terminal 3 is provided a write protect switch 6 for prohibiting the erasure and writing in the memory.

Figure 2:
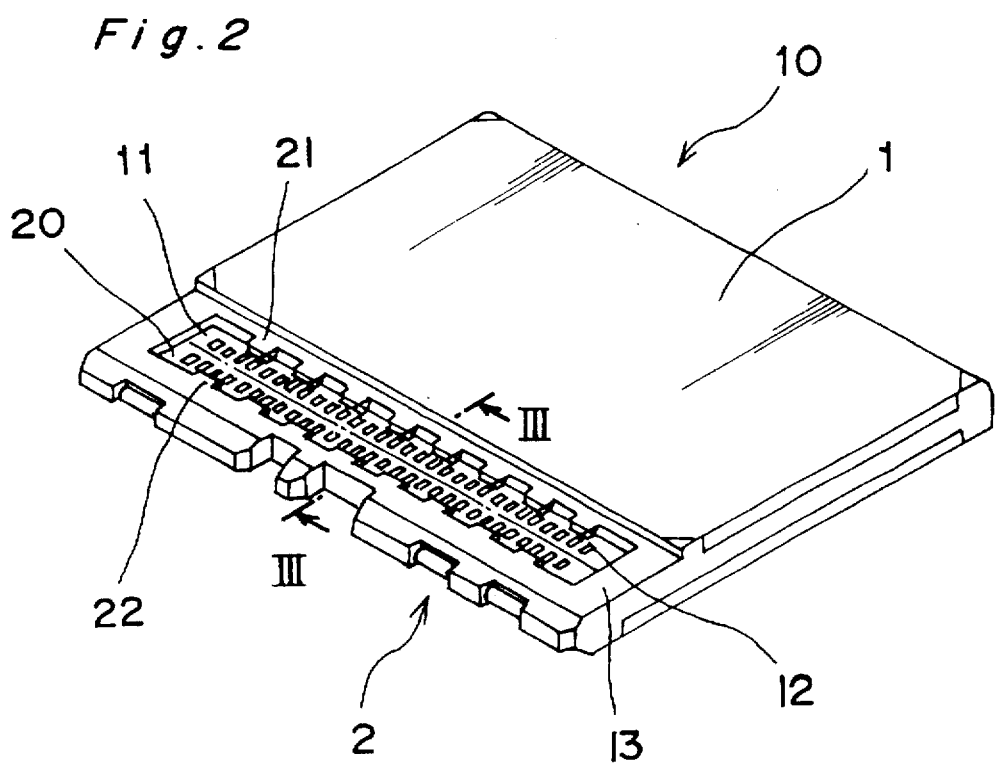
FIG. 2 is a perspective view of the lower surface of the card, as seen diagonally from below.
Figure 3:
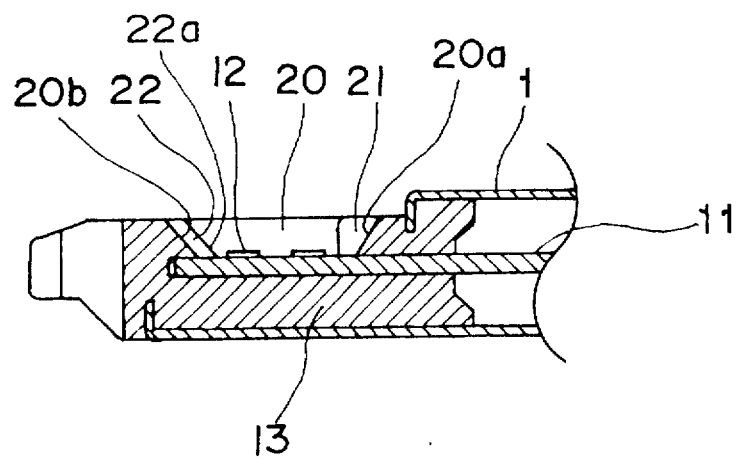
FIG. 3 is a section view of main parts of the connecting section of the card, taken along the line III—III of FIG. 2.

FIG. 2 is a perspective view of the lower surface of the card 10, as seen diagonally from below, and FIG. 3 is a section view of main parts of the connecting section 2 of the card 10, taken along the line III—III of FIG. 2. In FIG. 2, the holder section 13 is provided on a substrate 11 in the casing 1 so as to sandwich the substrate 11 and a groove 20 is provided on the holder section 13. On the substrate 11 at the bottom of the groove 20 are provided the plurality of electrode pads 12 which are arranged in two rows at fixed intervals in the direction of the rows. Both side walls 20a, 20b (shown in FIG. 3) of the groove 20 are respectively inclined so that the groove widens toward the opening from the bottom. A plurality of projections 21 projecting inwardly in the groove 20 are provided at fixed intervals on one side wall 20a (the one nearer to the center of the card 10) of the groove 20, while a plurality of projections 22 projecting inwardly in the groove 20 are provided at fixed intervals on the other side wall 20b of the groove 20 at the positions facing the plurality of projections 21. The shapes of the plurality of projections 21, 22 as seen in the direction of the normal to the bottom surface of the groove 20 are rectangular in general; on the plurality of projections 22 are respectively formed inclined surfaces 22a generally parallel to the side wall 20b of the groove 20 (see FIG. 3).

Figure 4:
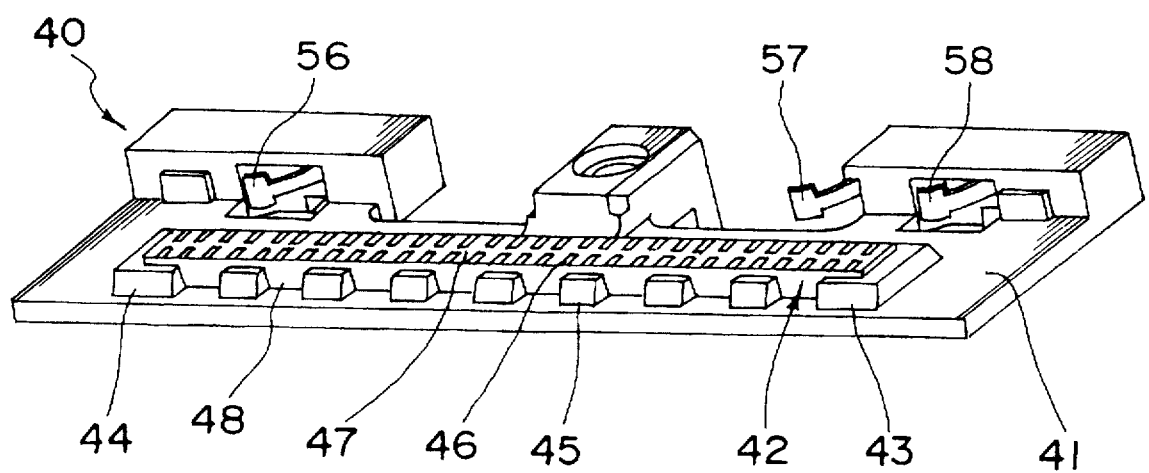
FIG. 4 is a perspective view of a socket to be connected to the card.

FIG. 4 is a perspective view of a socket 40 to which the connecting section 2 of the card 10 shown in FIG. 2 is to be connected. The socket 40 comprises a generally rectangular rubber connector 42 fixed to a plate-like socket base 41. The rubber connector 42 consists of a plurality of conductive sections 46 for contact respectively with the plurality of electrode pads 12 (shown in FIG. 3) on the card 10, and insulating sections 47 for insulating each conductive section 46. The socket 40 is provided with supporting sections 43, 44 for supporting both ends of the rubber connector 42, which sections have a square bracket shape in general. A plurality of supporting sections 45 for supporting one side of the rubber connector 42 on the socket 40 are provided at fixed intervals, so that the plurality of projections 21 provided on one side of the groove 20 in the card 10 shown in FIG. 2 fit into fitting sections 48 between adjoining supporting sections 43, 44, 45. On the other hand, a plurality of supporting sections (not shown) for supporting the other side of the rubber connector 42 on the socket 40 are provided at fixed intervals, so that the plurality of projections 22 provided on the other side of the groove 20 in the card 10 fit into fitting sections (not shown) between adjoining supporting sections. A source voltage supply pin 56 is provided in the vicinity of one end of the socket base 41 of the socket 40; in the vicinity of the other end of the socket base 41 are provided, from the center, a card-detecting pin 57 and a ground (GND) pin 58.

Figure 5:
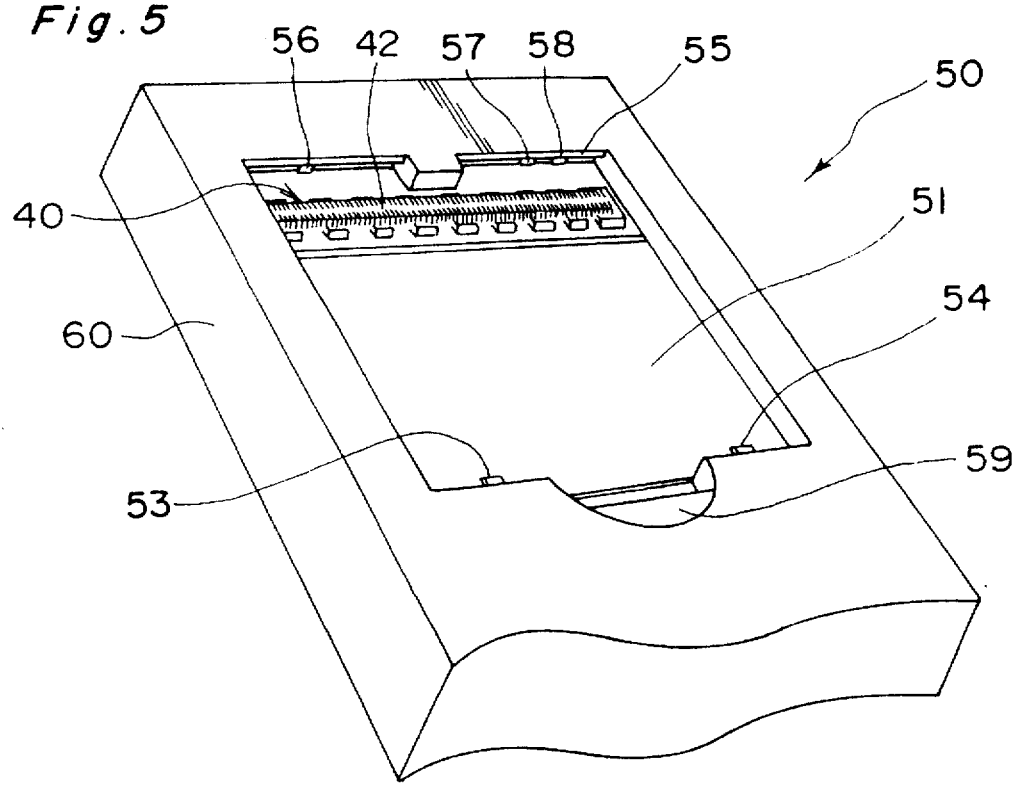
FIG. 5 is a perspective view of a mating apparatus to which the card is to be attached.

FIG. 5 is a perspective view of a mating apparatus 50 to which the card 10 shown in FIGS. 1 and 2 is to be attached. The mating apparatus 50 provided in a casing 60 comprises a recess 51 for housing a card, which recess has its opening shaped generally in a rectangle; to an area including one side of the recess 51 is mounted the socket 40 (shown in FIG. 4) comprising the source voltage supply pin 56, the card-detecting pin 57, the ground (GND) pin 58, and the rubber connector 42. There is provided a thin engaging flange 55 projecting horizontally from the upper edge of the recess 51 on the side of the socket 40. Engaging clicks 53, 54 for holding the card 10 are provided at an fixed interval on the other side edge opposed to the socket 40 in the recess 51. Between the engaging clicks 53, 54 in the recess 51 is provided a semicircular recess 59 for allowing a finger tip for the removal of the card 10.

Figure 6:
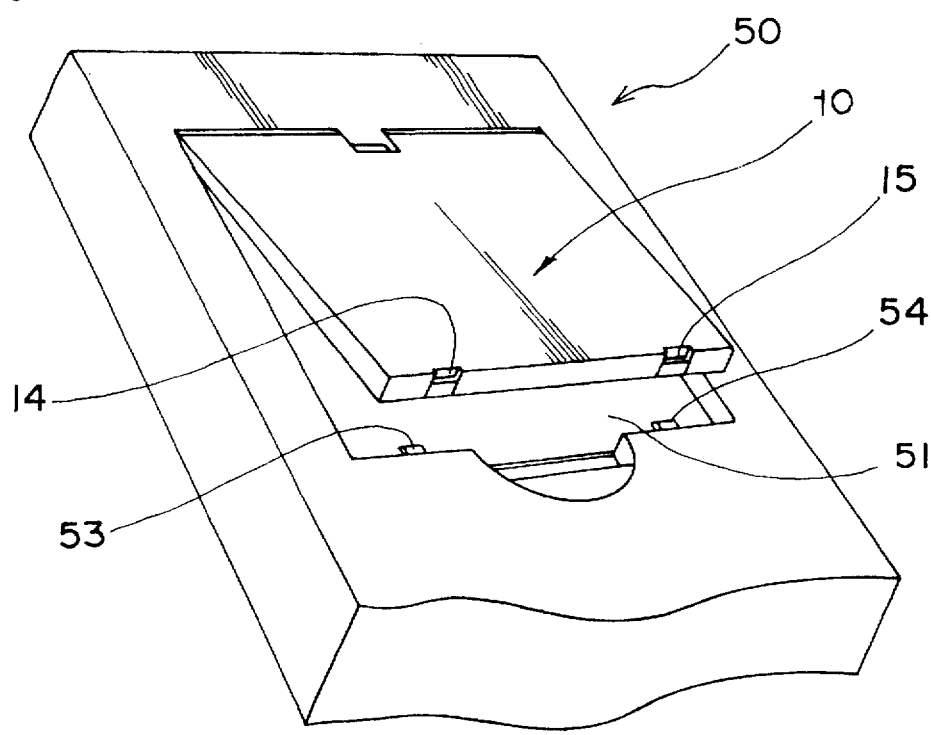
FIG. 6 is a perspective view of the card being attached to the mating apparatus.
Figure 7:
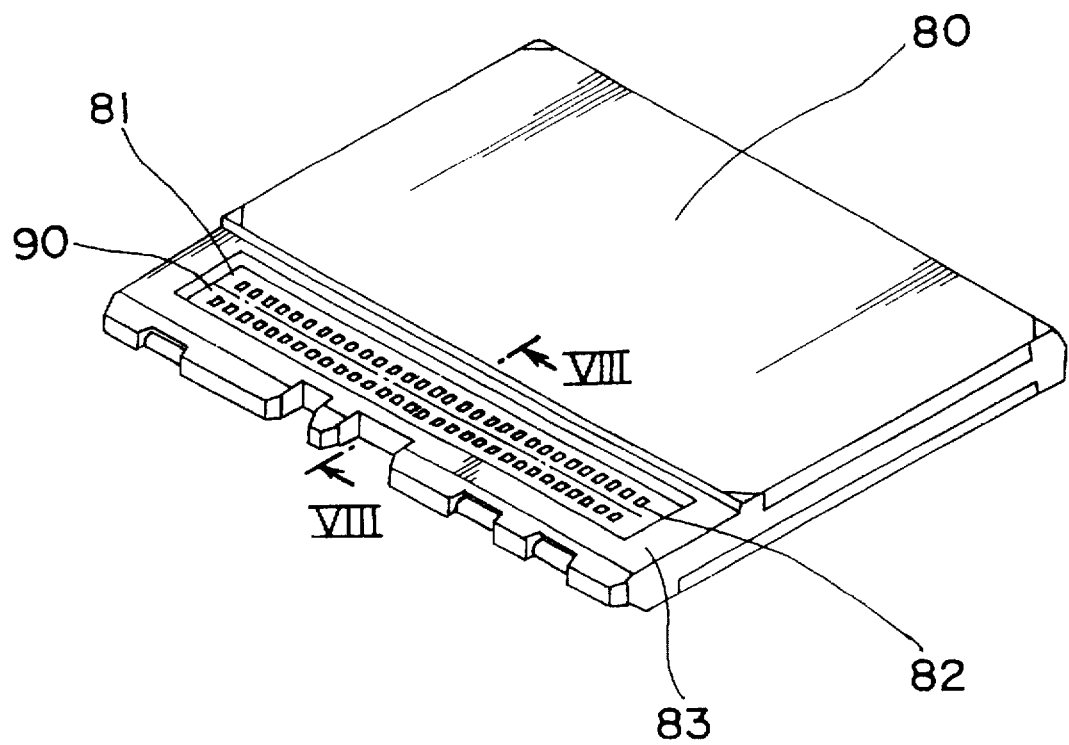
FIG. 7 is a perspective view of the lower surface of a conventional card, as seen diagonally from below.
Figure 8:
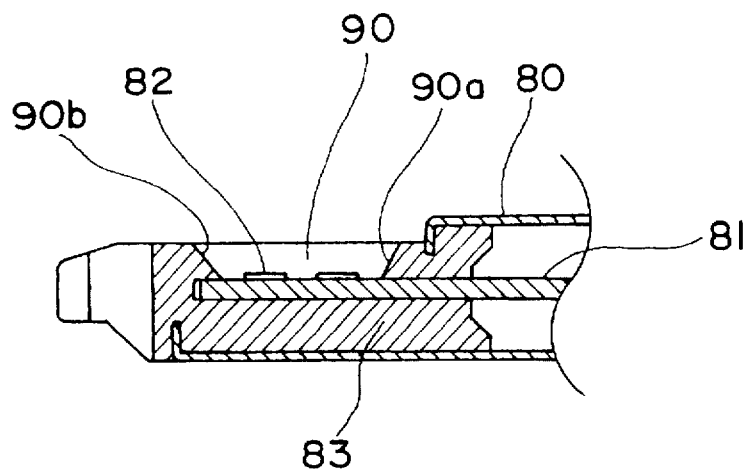
FIG. 8 is a section view taken along the line VIII—VIII of FIG. 7.

The card 10 is attached to the mating apparatus 50 as follows: the source voltage supply terminal 3, the ground terminal 5, and the card-detecting terminal 4 of the card are so fitted as to be in contact with the source voltage supply pin 56, the ground pin 58, and the card-detecting pin 57, respectively, which are provided in the socket 40; the connecting section 2 of the card 10 is engaged with the engaging flange 55; and then, as shown in FIG. 6, the edge of the card 10 opposed to the connecting section 2 is pressed into the recess 51 for housing a card. The card 10 is held by the engagement of engaging sections 14, 15 provided on the card 10 with the engaging clicks 53, 54 of the mating apparatus 50. At this time, the projections 21, 22 (shown in FIGS. 2 and 3) provided on the card 10 and the supporting sections 43, 44, 45 (shown in FIG. 4) provided on the socket 40 fit each other without interference, and the electrode pads 12 in the connecting section 2 of the card 10 and electrode pads (not shown) on a substrate (not shown) in the mating apparatus 50 are electrically connected respectively through the conductive sections 46 in the rubber connector 42 on the socket 40.

As described above, in the groove 20 provided on the holder section 13 of the card 10, sections having a relatively small width and sections having a relatively large width appear alternately along the groove 20 and both sides of the groove 20 have projections and depressions; this arrangement therefore prevents the direct contact of a human finger or the like with each electrode pad 12 at the bottom of the groove 20, and the destruction of ICs and the like connected to each electrode pad 12 due to static electricity charged on the human body, and prevents the contamination of the electrode pads 12 on the card 10 to maintain the conducting performance.

Because the shapes of the projections 21, 22 as seen in the direction of the normal to the bottom surface of the groove 20 are rectangular in general, the sections having a relatively large width and the sections having a relatively small width can be accurately formed alternately along the direction of the groove 20 and the groove 20 both sides of which have projections and depressions can be easily formed.

Because the mating apparatus 50 comprises the fitting sections 48 for holding the rubber connector 42 which employs conductive rubber and for allowing the projections 21, 22 of the card 10 to fit therein, the projections 21, 22 on the card 10 and the supporting sections 43, 44, 45 in the mating apparatus 50 fit each other without interference, so that the rubber connector 42 and the supporting sections 43, 44, 45 can be securely housed in the groove 20 on the card 10.

With the rubber connector 42 of the mating apparatus 50 employing conductive rubber, even though its conducting performance is degraded by the damage to the rubber connector 42, the conducting performance can be easily restored by the removal of the rubber connector 42 from the socket 40 and the replacement of the connector. Besides, in the case that sand, dust or the like is deposited on the electrode pads 12 in the connecting section 2 of the card 10, the conducting performance can be easily restored by wiping the surfaces of the electrode pads 12.

In the embodiment described above, the shapes of the plurality of projections 21, 22 of the card 10 as seen in the direction of the normal to the bottom surface of the groove 20 are rectangular in general; however, the shapes of the projections are not limited by the embodiment but have only to be such that both side walls of the groove in the holder section of the card-like apparatus have projections and depressions.

EXAMPLE

Hereinafter, compared with the conventional card 80, the card 10 to which the invention is applied will be described.

Figures 10A, 10B:
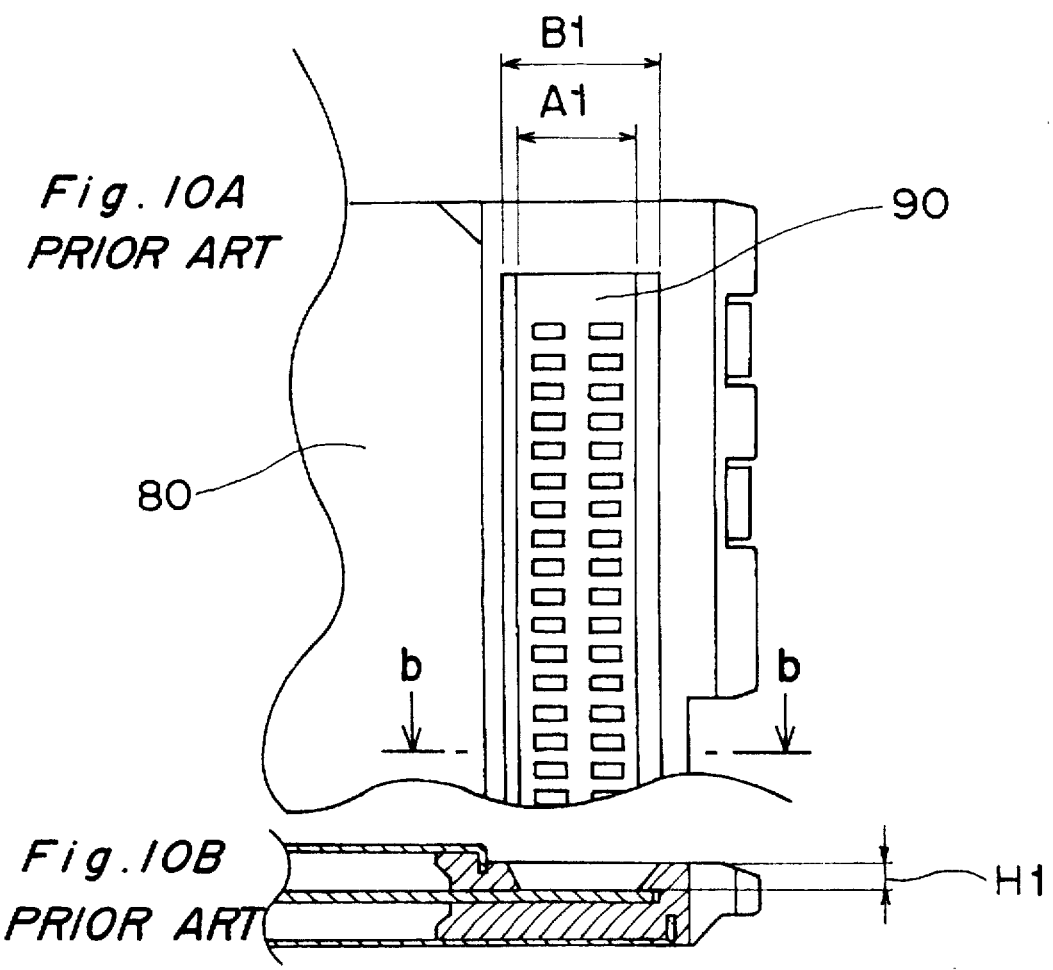
FIG. 10A is an enlarged view illustrating specific dimensions of main parts of the conventional card and FIG. 10B is a section view taken along the line b—b of FIG. 10A.
Figure 11A:
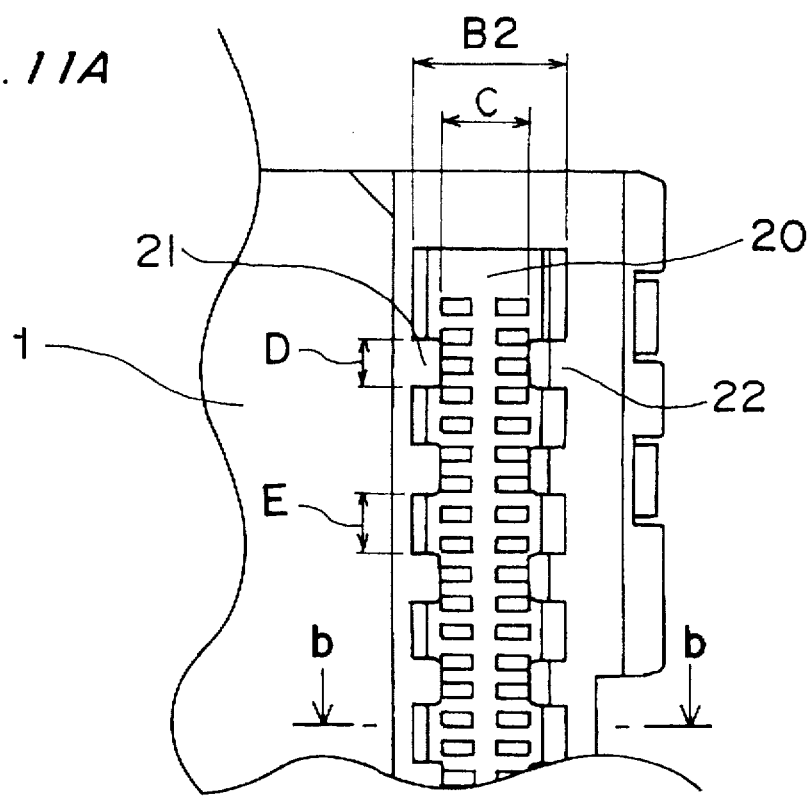
FIG. 11A is an enlarged view illustrating an embodiment of specific dimensions of main parts of the card shown in FIG. 2

FIG. 10A is an enlarged view illustrating specific dimensions of main parts of the conventional card 80 and FIG. 10B is a section view taken along the line b—b of FIG. 10A. FIG. 11A is an enlarged view illustrating an embodiment of specific dimensions of main parts of the card 10 according to the invention and FIG. 11B is a section view taken along the line b—b of FIG. 11A.

Figure 9:
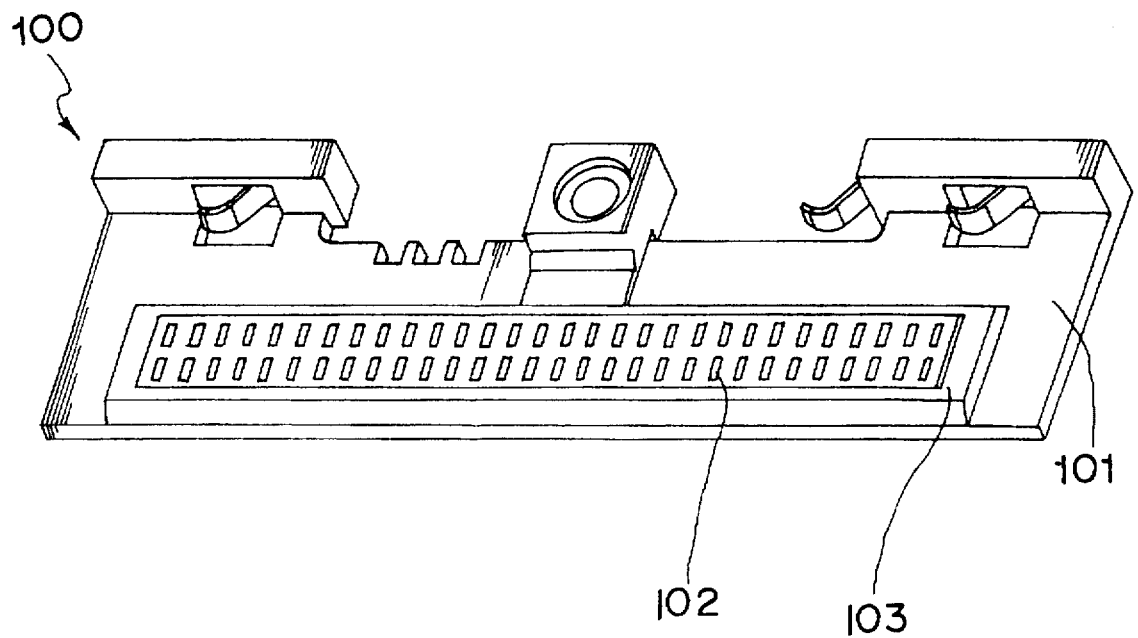
FIG. 9 is a perspective view of a socket to which the card shown in FIG. 7 is to be connected.
Figure 11B:
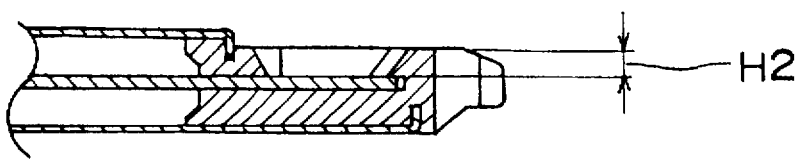
FIG. 11B is a section view taken along the line b—b of FIG. 11A.

The dimensions of main parts of the conventional card 80 shown in FIGS. 10A, 10B are as follows:

Width A1 of the bottom of the groove 90: 3.93 mm
Width B1 of the opening of the groove 90: 5.40 mm
Depth H1 of the groove 90: 0.78 mm On the other hand, the dimensions of main parts of the card 10 shown in FIGS. 11A, 11B are as follows:

Width B2 of the wider sections in the opening of the groove 20: 5.40 mm
Width C of the narrower sections in the opening of the groove 20: 3.35 mm
Size D of the projections 21, 22: 1.6 mm
Size E between the adjoining projections 21, 22: 2.0 mm
Depth H2 of the groove 20: 0.78 mm As shown, the supporting section 103 (shown in FIG. 9) for the rubber connector 102 of the conventional socket 100 is the supporting section 103 (shown in FIG. 9) with parallel long sides having neither projections nor depressions, and therefore, as shown in FIGS. 10, the width of the opening of the groove 90 on the conventional card 80 has to be large so that the groove 90 accommodates the supporting section 103. That is, the groove 90 of the card 80 which fits the socket 100 having the conventional supporting section 103 has a large, uniform width (B1=5.40 mm) because the long sides of the supporting section 103 are like parallel lines. As a result, when a human finger or the like touches the groove 90 in the conventional card 80, the human finger or the like easily comes into contact with the electrode pads 82 at the bottom of the groove 90; by contrast, in the card 10 to which the connecting structure for electronic equipment according to the invention is applied, the width of the narrower sections in the opening of the groove 20 is 3.35 mm and the size E of the wider sections in the opening of the groove 20 is as small as 2.00 mm, so that the contact of a human finger or the like with the pads is hindered.

What is claimed is:

1. A connecting structure for electronic equipment to electrically connect a card-like apparatus to a mating apparatus, the connecting structure comprising:

a groove provided on a holder section on a substrate housed in the card-like apparatus;

a plurality of electrode pads provided at the bottom of the groove;

a rubber connector provided on the mating apparatus, which can be electrically connected to the plurality of electrode pads and which employs conductive rubber; and a plurality of projections projecting inwardly in the groove at fixed intervals on both side walls of the groove and at positions facing each other on both side walls of the groove.

2. A connecting structure for electronic equipment as claimed in claim 1, wherein the shapes of the plurality of projections as seen in the direction of the normal to the bottom surface of the groove are rectangular in general.

3. A connecting structure for electronic equipment as claimed in claim 1, wherein fitting sections into which the plurality of projections on the card-like apparatus fit are provided in supporting sections for supporting the rubber connector of the mating apparatus.

* * * * *

UNITED STATES PATENT AND TRADEMARK OFFICE
CERTIFICATE OF CORRECTION

PATENT NO. : 5,757,622
DATED : May 26, 1998
INVENTOR(S) : Hidetake Tanaka and Takayoshi Yamagishi

It is certified that error appears in the above-identified patent and that said Letters Patent is hereby corrected as shown below:

On the title page, item [75], please change the second inventor's residence from "Kashihara" to --Kashiwara--

Signed and Sealed this

Fifteenth Day of September, 1998

Attest:

BRUCE LEHMAN

*Attesting Officer*           *Commissioner of Patents and Trademarks*